United States Patent [19]
Claverie

[11] Patent Number: 6,144,066
[45] Date of Patent: Nov. 7, 2000

[54] PROTECTION OF THE LOGIC WELL OF A COMPONENT INCLUDING AN INTEGRATED MOS POWER TRANSISTOR

[75] Inventor: Isabelle Claverie, Marseilles, France

[73] Assignee: SGS-Thomson Microelectronics S.A., Gentilly, France

[21] Appl. No.: 09/094,341

[22] Filed: Jun. 9, 1998

[30] Foreign Application Priority Data

Jun. 17, 1997 [FR] France ................................. 97 07741

[51] Int. Cl.[7] .......................... H01L 29/76; H01L 29/94; H01L 31/062; H01L 31/113; H01L 31/119
[52] U.S. Cl. ...................... 257/328; 257/329; 257/133; 257/134; 257/135; 257/267
[58] Field of Search .................. 257/267, 280, 257/281, 302, 133, 134, 135, 328, 329

[56] References Cited

U.S. PATENT DOCUMENTS

| | | | |
|---|---|---|---|
| 4,767,722 | 8/1988 | Blanchard | 437/41 |
| 5,077,586 | 12/1991 | Quessada | 357/15 |
| 5,099,302 | 3/1992 | Pavlin | 357/42 |
| 5,294,814 | 3/1994 | Das | 257/77 |
| 5,665,988 | 9/1997 | Huang | 257/133 |
| 5,760,440 | 6/1998 | Kitamura et al. | 257/328 |
| 5,780,895 | 7/1998 | Barret et al. | 257/328 |

OTHER PUBLICATIONS

French Search Report from French Patent Application No. 97 07741, filed Jun. 17, 1997.

Primary Examiner—David Hardy
Assistant Examiner—Jesse A. Fenty
Attorney, Agent, or Firm—Wolf, Greenfield & Sacks, P.C.; James H. Morris; Theodore E. Galanthay

[57] ABSTRACT

The present invention relates to a structure for ground connection on a component including a vertical MOS power transistor and logic components, the substrate of a first type of conductivity of the component corresponding to the drain of the MOS transistor and the logic components being formed in at least one well of the second type of conductivity and on the upper surface side of the substrate. In the logic well, a region of the first type of conductivity is formed, on which is formed a metallization, to implement, on the one hand, an ohmic contact, and on the other hand, a rectifying contact.

41 Claims, 3 Drawing Sheets

PROTECTION OF THE LOGIC WELL OF A COMPONENT INCLUDING AN INTEGRATED MOS POWER TRANSISTOR

BACKGROUND OF THE INVENTION

1. Field of the Invention

The present invention relates to components associating in the same substrate vertical diffused-Type MOS power transistors (VDMOS) and logic circuits, and more specifically relates to the use of such components in circuits supplied by a battery, such as automobile circuits.

2. Discussion of the Related Art

FIG. 1 very schematically shows a portion of such a component. This component includes an N-type substrate generally formed of an N-type epitaxial layer 1 formed on an N$^+$-type substrate 2. A power transistor is formed in the right-hand portion and a logic well is formed in the left-hand portion.

The power transistor includes a set of identical cells connected to one another, such as cell 3. Each cell includes a P-type well 4, the central portion 5 of which is more heavily doped. An N-type ring 6 is formed in the upper portion of the well. The portion separating the external periphery of ring 6 from the external periphery of well 4 is coated with an isolated gate 8. N-type ring 6 as well as central portion 5 of the well are coated with a metallization 9. All gates 8 are connected to a gate terminal G and all metallizations 9 are connected to a source terminal S. The rear surface of the structure is coated with a drain metallization D. Thus, when a gate signal is applied, a current is likely to flow from terminal D to terminal S from N regions 1 and 2 to N regions 6, via a channel formed under the insulated gates. This structure is generally used so that the drain is biased to a positive potential with respect to the source.

Elements of logic circuits are formed in one or several wells 10. An elementary MOS transistor 11 having drain, source, and gate terminals g, d, and s has been shown in a well 10. This is only an example of a component that could be formed in a logic well.

The voltages on the several components formed in the logic well must be applied with respect to a reference. The simplest way to provide this reference, that is, to implement a ground connection, is illustrated in FIG. 1 and corresponds to the use of a well contacting area 12 formed on a region 13 of same type (P) as the well and more heavily doped. Contact 12 may be connected directly to the ground in simple embodiments. Generally, it should be understood that, for example, high voltages VDD are applied to some drains of the MOS transistors of the logic circuit which have their sources connected to contact 12 and to the ground.

FIG. 2 shows an example of an assembly of a component of the type shown in FIG. 1. The component is generally designated by block 20 surrounded with a frame in dotted lines. A reverse diode D1 is illustrated in parallel between the drain and the source of MOS power transistor T and corresponds to the junction between N-type substrate 1 and P-type region 5. Well 10 is represented by a block and it is assumed that it is connected to drain D of the MOS transistor via a diode D2 corresponding to the junction between substrate 1 and well 10.

In a very simple example of assembly, contact 12 of the well is grounded by a connection 21; and the source of the power transistor is connected to the ground via a load L, the switched supply of which is desired to be performed by the power transistor. A supply source such as a battery 23 is connected between the ground and drain terminal D of power transistor T. Thus, in normal operation, diodes D1 and D2 are reverse biased. According to its control, transistor T will be turned on or not and no current flows from the ground (contact 12) to the rear surface of the component (terminal D) due to the existence of reverse-biased diode D2.

Two incidents likely to occur in battery-powered circuits, and more specifically in automobile circuits, should however be considered.

The first incident corresponds to a biasing inversion of the battery. Diodes D1 and D2 are then forward biased. The current in diode D1 is limited by the presence of load L. Thus, the current will essentially flow through diode D2, as indicated by arrow 24. This current is likely to be destructive.

A second incident corresponds to a supply interruption, or battery disconnection, likely to occur when, due to vibrations or for any other reason, a lead wire of the battery breaks or operates intermittently. Then, if load L is inductive, the current will continue to flow therethrough according to the path designated by arrow 26. It should be noted that this current will necessarily exist, load L having to be considered as a current source. In the case of the simple assembly of FIG. 1, this current flow raises no specific problem. The problems result from the use of known protections against battery voltage inversions, as will be seen hereafter.

A first conventional solution to solve the battery inversion problem consists of inserting a diode, biased in a direction opposite to that of diode D2, in series with the well. The inserting of a diode may for example be performed in the way illustrated in FIG. 1, by adding an N$^+$-type region 15, grounding this region 15 by a connection 17, and suppressing the connection to ground 21. Various solutions have been provided to optimize the operation of this diode, and to have a well referenced to the ground when the circuit is in a normal operation state. Reference will especially be made to U.S. Pat. No. 5,099,302 (Antoine Pavlin) relating to an active diode which is incorporated herein by reference. There still remains the problem that, in the case of a battery disconnection, current 26 will have to cross an avalanching diode and will dissipate a high power therein, which can cause a destruction of the component, unless a diode having a large surface is provided, which unduly increases the cost of the component.

A second conventional solution to the battery inversion problem consists of placing in series in connection 21 a resistor, a terminal of which will form the ground connection. But a new dilemma, difficult to solve, arises. Indeed, in normal operation, the resistance must be as low as possible to limit the voltage drop thereacross caused by the consumption of the elements of the logic circuit. Conversely, to solve the problems linked to the battery inversion case, this resistance must be as high as possible to limit the current flowing through the well.

SUMMARY OF THE INVENTION

Thus, an object of the present invention is to provide a structure for ground connection of the logic well of a component integrating a power transistor and logic elements which does not adversely affect the normal state operation, which prevents the current flow in the logic circuit in case of a battery inversion, and which lets through the current resulting from a battery disconnection.

To achieve these and other objects, the present invention provides a structure for ground connection on a component including a vertical MOS power transistor and logic components, the substrate of a first type of conductivity of the component corresponding to the drain of the MOS transistor and the logic components being formed in at least one well of the second type of conductivity and on the upper surface side of the substrate. This structure includes, in the logic well, a region of the first type of conductivity on which is formed a metallization, to implement, on the one hand, an ohmic contact, and on the other hand, a rectifying contact.

According to an embodiment of the present invention, the rectifying contact corresponds to a contact with regions of the second type of conductivity.

According to an embodiment of the present invention, the rectifying contact corresponds to a Schottky contact.

The foregoing objects, features and advantages of the present invention will be discussed in detail in the following non-limiting description of specific embodiments in connection with the accompanying drawings.

DETAILED DESCRIPTION

In the various drawings, same elements are referred to with same references. Further, in the various cross-sectional views of semiconductor components, as is usual, the various dimensions are not drawn to scale but are arbitrarily expanded to facilitate the readability of the drawings.

Figure 1:
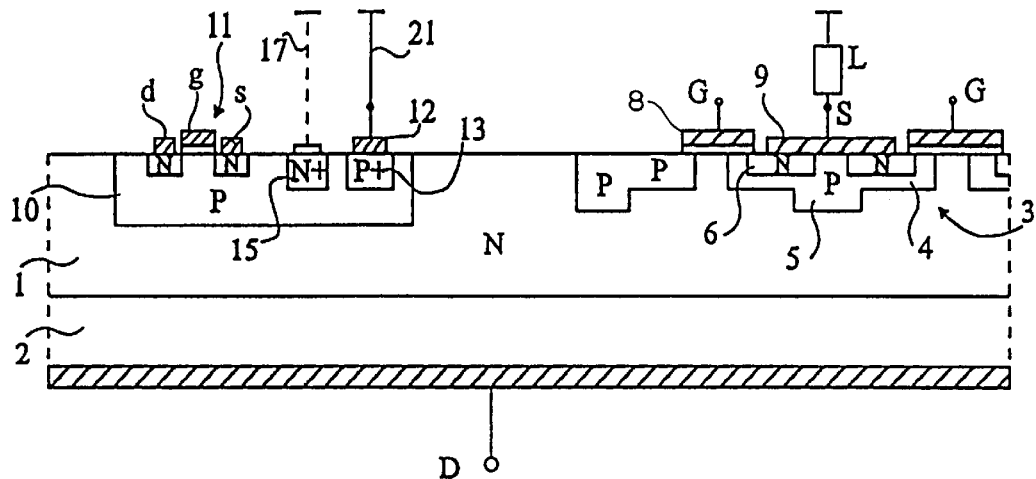
FIG. 1 shows a conventional structure of a component associating a vertical MOS transistor and logic circuits.
Figure 2:
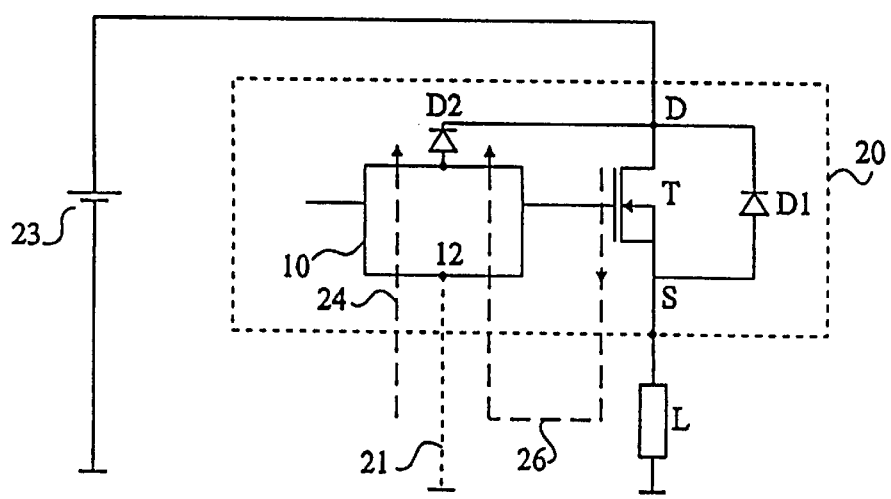
FIG. 2 shows an example of assembly of the component of FIG. 1 associated with a battery.

The ground connection structure according to the present invention includes an N-type region 30 formed in logic well 10. Alternate $N^+$ and $P^+$-type regions, respectively designated by references 31 and 32 are formed in this N-type region, for example, in the form of a grid. Regions 31 and 32 are altogether coated with a metallization 33, itself normally connected to the circuit ground by a connection corresponding to connection 21 of FIG. 2.

Figure 4A:
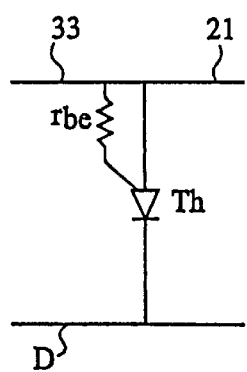
FIGS. 4A and 4B show equivalent diagrams associated with the ground connection structure according to the present invention.
Figure 4B:
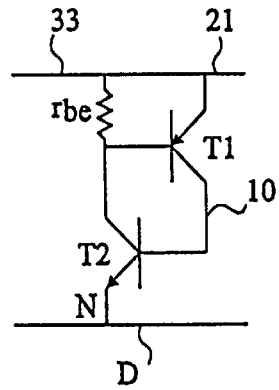

FIGS. 4A and 4B show two forms of an equivalent diagram of the ground connection structure, seen between connection 21 and terminal D (rear surface of the component). It can be considered that this structure corresponds to a thyristor Th, the anode of which corresponds to metallization 33 and the cathode of which corresponds to rear surface metallization D. The thyristor anode will correspond to $P^+$-type regions 32, and a resistive region will be located between the anode and the anode gate of this transistor, this resistor being referred to by reference $r_{be}$. FIG. 4B shows the same diagram, but in which the thyristor has been shown conventionally in the form of its equivalent transistors. $P^+$-type region 32, N well 30, and P-type well region 10 form a PNP transistor T1, the emitter of which is connected to metallization 33 and the base of which is connected via resistor rbe to metallization 33. Region 30, well 10, and substrate 1 form an NPN transistor T2, the emitter of which is connected to drain metallization D, the collector of which is connected to the base of transistor T1, and the base of which is connected to the collector of transistor T1. It should be noted that the common base region of transistor T2 and collector region of transistor T1 corresponds to well 10, that is, to reference potential VSS of the elements of the logic circuit formed in well 10.

Thus, during normal circuit operation, thyristor Th is reverse biased and no current can flow through the junction between substrate 1 and well 10.

Figure 4C:
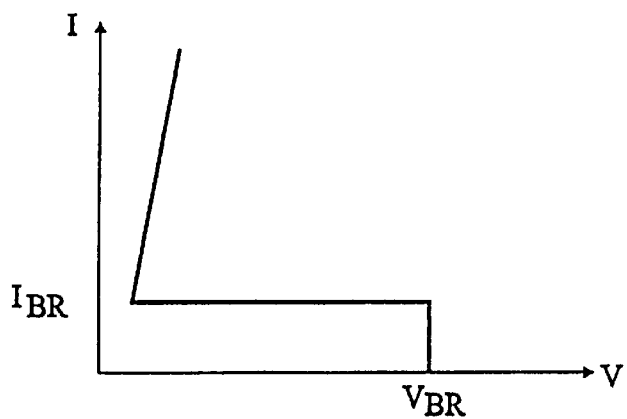
FIG. 4C shows a current-voltage characteristic.

The current-voltage characteristic of the structure appears in FIG. 4C in which a voltage V on metallization 33 is assumed to be positive with respect to terminal D which is then grounded, which occurs in case of a battery inversion. The junction between N well 30 and P well 10 is reverse biased and no current can flow as long as the applied voltage is lower than breakdown voltage $V_{BR}$ of this junction. The structure must be implemented so that voltage $V_{BR}$ is higher than the reverse battery voltage, to protect the logic portion of the circuit formed in well 10.

In case of a battery disconnection, inductive load L causes a current to flow which forces the junction between N well 30 and P well 10 to start an avalanche. When the current flowing through resistor $r_{be}$ reaches a threshold value, noted $I_B R$ on FIG. 4C, such that the value of the voltage drop across the resistor is higher than 0.6 V, transistor T1 turns on. This supplies the base of transistor T2, which also turns on. In other words, this causes the break-over of thyristor Th and the voltage drop across this thyristor becomes very low, which allows dissipation of high currents without any risk of destruction in case of a battery disconnection under an inductive load. Break-over threshold $I_{BR}$ must be optimized so that it is high enough not to cause any untimely break-over of the characteristic in case of battery inversion, and low enough for the structure to be able to dissipate current $I_{BR}$ under breakdown voltage $V_{BR}$.

Figure 5:
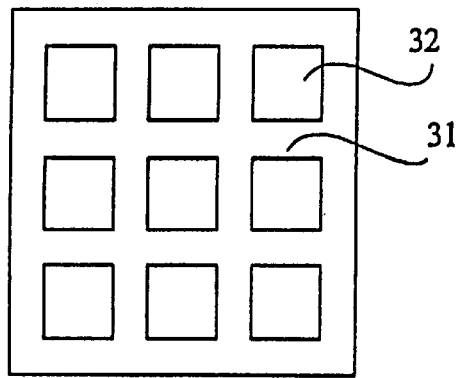
FIG. 5 shows a simplified top view of an example of a ground connection structure according to the present invention.

It should be noted, according to a first advantage of the present invention, that the triggering threshold of the protection circuit according to the present invention is easily adjustable. Indeed, considering a top view of this protection structure, such as shown in FIG. 5, P-type regions 32 can be considered as a grid separated by N-type regions 31. The surface ratio between P and N regions 32 and 31 determines the value of resistance rbe. The surface ratio between the P and N regions will for example be on the order of 15 to 1, the triggering current being lower when this ratio is higher. In an example of embodiment, each of squares 32 can have a side on the order of 8 $\mu$m and the distance between two squares can be 2 $\mu$m.

According to another advantage of the present invention, metallization 33 does not have a larger surface than the surface normally provided to establish a contact pad on P well 10. Thus, there is no surface increase with respect to the normal implementation of the well. It will again be stressed that the representations of the various drawings are not to scale.

Figure 3:
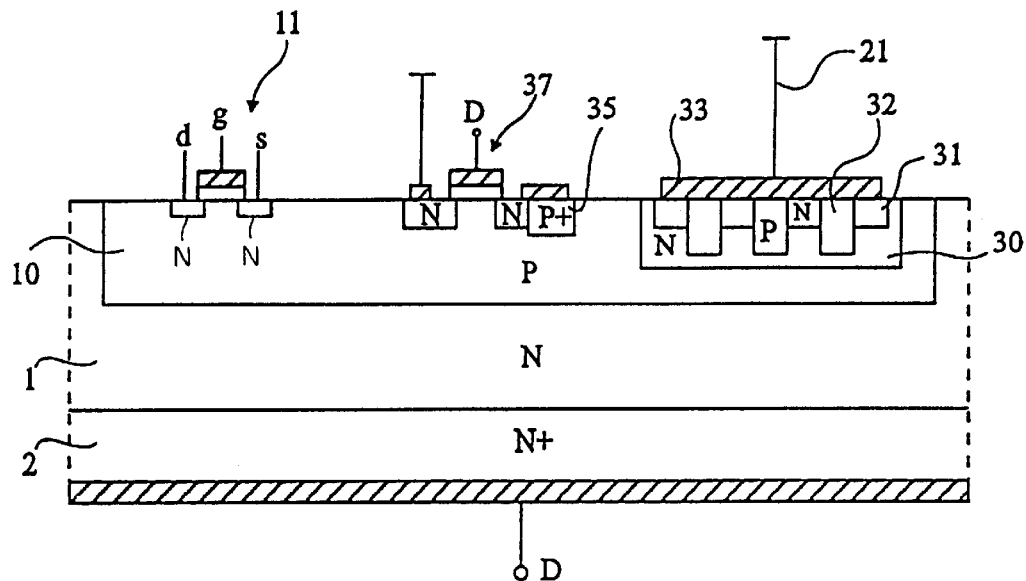
FIG. 3 shows a logic well ground connection structure according to the present invention.

The operating modes in battery inversion and disconnection states have been described hereabove. The logic well also has to be at the ground potential in normal operation. For this purpose, a structure such as illustrated in FIG. 3 may for example be used, taking inspiration from the structure described in above-mentioned U.S. Pat. No. 5,099,302. For example, a heavily-doped P-type region 35 connected to the ground via a MOS transistor 37 is provided. The gate of transistor 37 is connected to terminal D, whereby MOS transistor 37 is on when the battery is properly connected (normal operation) and off in all other cases (battery inversion or disconnection state).

Figure 6:
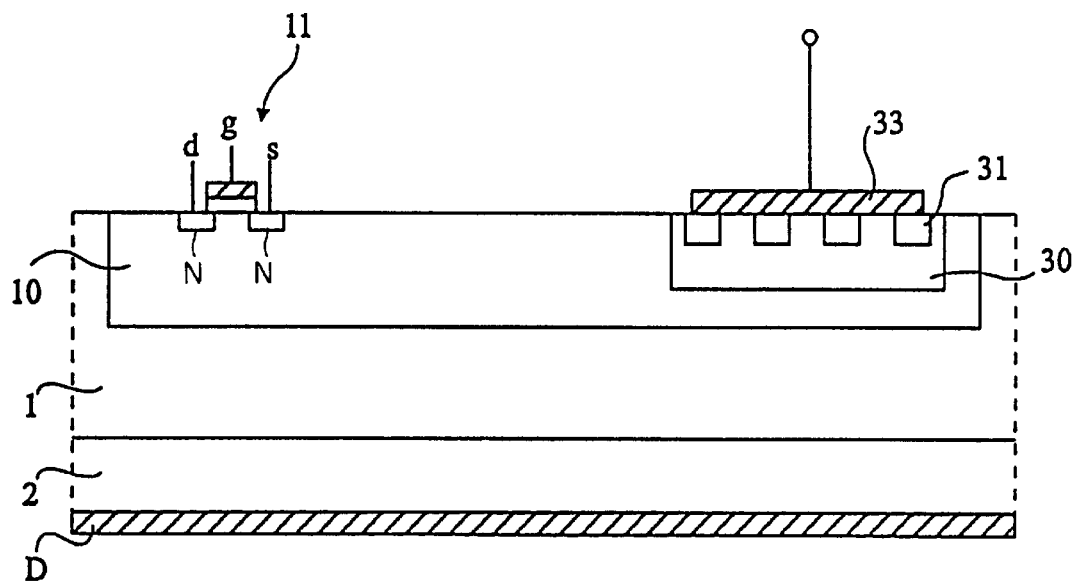
FIG. 6 shows an alternative of a ground connection structure according to the present invention.

FIG. 6 shows an alternative of the circuit according to the present invention in which the same elements as in FIG. 3 appear, designated by the same references. The difference between the two drains is that P⁺-type regions 32 have been suppressed and the doping level of N-type region 30 is chosen to form a Schottky diode with metallization 33, which will for example be made of aluminum. The Schottky diode causes a limited injection of minority carriers, which is less efficient than P⁺-N junction 32-30, but sufficient to create a bipolar effect similar to that created by transistor T1 of FIG. 4B. This structure has the advantage of eliminating one P⁺ masking level.

Of course, the present invention is likely to have various alterations, modifications, and improvements which will readily occur to those skilled in the art. Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A semiconductor device for providing a ground connection to a component, the component including a vertical MOS power transistor and logic components, the semiconductor device including:
   a substrate having a first conductivity type, the substrate corresponding to a drain of the MOS power transistor;
   a first well having a second conductivity type in an upper surface side of the substrate, the logic components being formed in the first well, the first well further including;
   a second well having the first conductivity type and a first doping level; and
   a first region having the first conductivity type and a second doping level greater than the first doping level, the first region being formed within the second well; and
   a metallization contacting the second well and the first region, the metallization forming an ohmic contact with the first region and a rectifying contact with the second well.

2. The device of claim 1, wherein:
   the second well includes a second region having the second conductivity type; and
   the metallization contacts the second region to form the rectifying contact.

3. The of claim 1, wherein:
   the first doping level is such that the metallization and the second well form a Schottky diode; and
   the rectifying contact is a Schottky contact.

4. A semiconductor device, comprising:
   a substrate having a first conductivity type;
   a first well formed in the substrate, the first well having a second co pe and a first doping level;
   a second well formed in the first well, the second well having the first conductivity type and a second doping level;
   at least one first region formed in the second well, the at least one first region having the first conductivity type and having a third doping level greater than the second doping level;
   further including a first metallization contacting the at least one first region; wherein:
   the at least one first region includes a plurality of first regions; and
   the first metallization contacts each first region of the plurality of first regions.

5. A semiconductor device, comprising:
   a substrate having a first conductivity type;
   a first well formed in the substrate, the first well having a second conductivity type and a first doping level;
   a second well formed in the first well, the second well having the first conductivity type and a second doping level;
   at least one first region formed in the second well, the at least one first region having the first conductivity type and having a third doping level greater than the second doping level;
   further including a first metallization contacting the at least one first region;
   further including a plurality of second regions formed in the second well, the plurality of second regions having the second conductivity type.

6. The device of claim 5, wherein the first metallization additionally contacts each second region of the plurality of second regions.

7. The device of claim 5, wherein the plurality of second regions has a fourth doping level greater than the first doping level.

8. The device of claim 5, wherein the plurality of second regions are formed in the at least one first region.

9. The device of claim 8, wherein the plurality of second regions are arranged as a two dimensional array in the at least one first region.

10. The device of claim 8, wherein each second region of the plurality of second regions forms an island in the at least one first region.

11. The device of claim 8, wherein the at least one first region and the plurality of second regions form a resistor.

12. The device of claim 11, wherein a surface area ratio between the at least one first region and the plurality of second regions determines a resistance of the resistor.

13. The device of claim 8, wherein the substrate, the first well, the second well, and the plurality of second regions form a thyristor.

14. The device of claim 13, wherein a forward breakdown voltage of the thyristor at a junction between the first well and the second well is determined by the first doping level and the second doping level.

15. The device of claim 14, wherein:
   the at least one first region and the plurality of second regions form a resistor;
   a surface area ratio between the at least one first region and the plurality of second regions determines a resistance of the resistor; and
   the surface area ratio is selected such that the resistance of the resistor is based on the forward breakdown voltage of the thyristor.

16. The device of claim 5, wherein the at least one first region includes a plurality of first regions.

17. The device of claim 16, wherein the first metallization contacts each first region of the plurality of first regions and each second region of the plurality of second regions.

18. The device of claim 16, wherein each second region of the plurality of second regions is contiguous with at least one first region of the plurality of first regions.

19. The device of claim 16, wherein the plurality of first regions and the plurality of second regions are arranged in an alternating manner in a cross-section of the second well.

20. The device of claim 16, wherein the plurality of first regions and the plurality of second regions form a resistor.

21. The device of claim 20, wherein a surface area ratio between the plurality of first regions and the plurality of second regions determines a resistance of the resistor.

22. The device of claim 16, wherein the substrate, the first well, the second well, and the plurality of second regions form a thyristor.

23. The device of claim 22, wherein a forward breakdown voltage of the thyristor at a junction between the first well and the second well is determined by the first doping level and the second doping level.

24. The device of claim 23, wherein:
the plurality of first regions and the plurality of second regions form a resistor;
a surface area ratio between the plurality of first regions and the plurality of second regions determines a resistance of the resistor; and
the surface area ratio is selected such that the resistance of the resistor is based on the forward breakdown voltage of the thyristor.

25. A semiconductor device, comprising:
a substrate having a first conductivity type;
a first well formed in the substrate, the first well having a second conductivity type and a first doping level;
a second well formed in the first well, the second well having the first conductivity type and a second doping level;
at least one first region formed in the second well, the at least one first region having the first conductivity type and having a third doping level greater than the second doping level;
further including a first metallization contacting the at least one first region;
further including a plurality of second regions formed in the second well, the plurality of second regions having the second conductivity type
further including a first logic component formed in the first well.

26. The device of claim 25, wherein the first logic component is a MOS transistor.

27. The device of claim 25, further including a second logic component formed in the first well.

28. The device of claim 27, wherein the second logic component is a MOS transistor.

29. The device of claim 28, wherein:
the second logic component includes a gate metallization; and
the device further includes a second metallization contacting the substrate.

30. The device of claim 29, wherein:
the first metallization is electrically connected to a ground; and
the gate metallization and the second metallization are electrically connected to a same potential.

31. The device of claim 30, wherein the second logic component connects the first well to the ground.

32. A semiconductor device, comprising:
a substrate having a first conductivity type;
a first well formed in the substrate, the first well having a second conductivity type an first doping level;
a second well formed in the first well, the second well having the first conductivity type and a second doping level;
at least one first region formed in the second well, the at least one first region having the first conductivity type and having a third doping level greater than the second doping level;
further including a first metallization counting the at least one first region;
wherein the first metallization further contacts at least a portion of the second well.

33. The device of claim 32, wherein the second doping level is such that the portion of the second well and the first metallization contacting the portion form a Schottky diode.

34. The device of claim 33, wherein the first metallization is aluminum.

35. The device of claim 33, further including a first logic component formed in the first well.

36. The device of claim 35, wherein the first logic component is a MOS transistor.

37. The device of claim 33, further including a second logic component formed in the first well.

38. The device of claim 37, wherein the second logic component is a MOS transistor.

39. The device of claim 38, wherein:
the second logic component includes a gate metallization; and
the device further includes a second metallization contacting the substrate.

40. The device of claim 39, wherein:
the first metallization is electrically connected to a ground; and
the gate metallization and the second metallization are electrically connected to a same potential.

41. The device of claim 40, wherein the second logic component connects the first well to the ground.

* * * * *

UNITED STATES PATENT AND TRADEMARK OFFICE
CERTIFICATE OF CORRECTION

PATENT NO.        : 6,144,066
APPLICATION NO. : 09/094341
DATED              : November 7, 2000
INVENTOR(S)       : Isabelle Claverie Page 1 of 1

It is certified that error appears in the above-identified patent and that said Letters Patent is hereby corrected as shown below:

Claim 4, column 5, line 60 should read:
--second conductivity type and a first doping level;--

Claim 32, column 8, line 21 should read:
--further including a first metallization contacting the at least--

Signed and Sealed this

Seventeenth Day of November, 2009

David J. Kappos
*Director of the United States Patent and Trademark Office*